United States Patent
Rudmann et al.

(10) Patent No.: US 10,243,111 B2
(45) Date of Patent: Mar. 26, 2019

(54) OPTOELECTRONIC DEVICE SUBASSEMBLIES AND METHODS OF MANUFACTURING THE SAME

(71) Applicant: Heptagon Micro Optics Pte. Ltd., Singapore (SG)

(72) Inventors: Hartmut Rudmann, Jona (CH); Qichuan Yu, Singapore (SG); Simon Gubser, Weesen (CH); Bojan Tesanovic, Steinhausen (CH); Xu Yi, Singapore (SG); Eunice Ho Hui Ong, Singapore (SG); Hongyuan Liu, Singapore (SG); Ji Wang, Singapore (SG); Edmund Koon Tian Lua, Singapore (SG); Myo Paing, Singapore (SG); Jian Tang, Singapore (SG); Ming Jie Lee, Singapore (SG)

(73) Assignee: ams Sensors Singapore Pte. Ltd., Singapore (SG)

(*) Notice: Subject to any disclaimer, the term of this patent is extended or adjusted under 35 U.S.C. 154(b) by 0 days.

(21) Appl. No.: 15/631,361

(22) Filed: Jun. 23, 2017

(65) Prior Publication Data
US 2018/0006192 A1    Jan. 4, 2018

Related U.S. Application Data

(60) Provisional application No. 62/459,223, filed on Feb. 15, 2017, provisional application No. 62/459,245, (Continued)

(51) Int. Cl.
*H01L 33/48*    (2010.01)
*H01L 25/16*    (2006.01)
(Continued)

(52) U.S. Cl.
CPC .......... *H01L 33/486* (2013.01); *H01L 25/167* (2013.01); *H01L 31/0203* (2013.01);
(Continued)

(58) Field of Classification Search
CPC ....... H01L 33/486; H01L 33/62; H01L 33/58; H01L 33/54
(Continued)

(56) References Cited

U.S. PATENT DOCUMENTS 8,606,057 B1    12/2013 Rudmann et al.
9,063,005 B2     6/2015 Rudmann et al.
(Continued)

FOREIGN PATENT DOCUMENTS

EP    1 858 086    11/2007
WO    WO 2015/038064    3/2015
(Continued)

*Primary Examiner* — Anthony Ho
(74) *Attorney, Agent, or Firm* — Fish & Richardson P.C.

(57) ABSTRACT

The present disclosure describes wafer-level processes for fabricating optoelectronic device subassemblies that can be mounted, for example, to a circuit substrate, such as a flexible cable or printed circuit board, and integrated into optoelectronic modules that include one or more optical subassemblies stacked over the optoelectronic device subassembly. The optoelectronic device subassembly can be mounted onto the circuit substrate using solder reflow technology even if the optical subassemblies are composed of materials that are not reflow compatible.

20 Claims, 6 Drawing Sheets

Related U.S. Application Data filed on Feb. 15, 2017, provisional application No. 62/408,183, filed on Oct. 14, 2016, provisional application No. 62/356,161, filed on Jun. 29, 2016.

(51) Int. Cl.

| | |
|---|---|
| *H01L 31/02* | (2006.01) |
| *H01L 31/0203* | (2014.01) |
| *H01L 31/0232* | (2014.01) |
| *H01L 33/54* | (2010.01) |
| *H01L 33/58* | (2010.01) |
| *H01L 33/62* | (2010.01) |

(52) U.S. Cl.
CPC .. *H01L 31/02005* (2013.01); *H01L 31/02325* (2013.01); *H01L 33/54* (2013.01); *H01L 33/58* (2013.01); *H01L 33/62* (2013.01); *H01L 2224/48091* (2013.01); *H01L 2224/73265* (2013.01); *H01L 2924/16195* (2013.01); *H01L 2933/005* (2013.01); *H01L 2933/0033* (2013.01); *H01L 2933/0058* (2013.01); *H01L 2933/0066* (2013.01)

(58) Field of Classification Search
USPC .......................................................... 438/27
See application file for complete search history.

(56) References Cited

U.S. PATENT DOCUMENTS

| | | | |
|---|---|---|---|
| 9,634,051 | B2 | 4/2017 | Heimgartner et al. |
| 2003/0146384 | A1 | 8/2003 | Logsdon et al. |
| 2008/0278954 | A1 | 11/2008 | Spier |
| 2014/0021491 | A1* | 1/2014 | Meng ...................... H01L 33/54 257/82 |
| 2015/0115413 | A1 | 4/2015 | Rudmann |
| 2015/0292709 | A1* | 10/2015 | Petronius ................ B23P 11/00 348/222.1 |
| 2015/0308639 | A1 | 10/2015 | Keranen et al. |

FOREIGN PATENT DOCUMENTS

| | | |
|---|---|---|
| WO | WO 2016/163953 | 10/2016 |
| WO | WO 2017/007425 | 1/2017 |

* cited by examiner

OPTOELECTRONIC DEVICE SUBASSEMBLIES AND METHODS OF MANUFACTURING THE SAME

CROSS-REFERENCE TO RELATED APPLICATION(S)

This application claims the benefit of priority of U.S. Provisional Application No. 62/459,223 filed on Feb. 15, 2017; U.S. Provisional Application No. 62/459,245 filed on Feb. 15, 2017; U.S. Provisional Application No. 62/408,183 filed on Oct. 14, 2016; and U.S. Provisional Application No. 62/356,161 filed on Jun. 29, 2016.

FIELD OF THE DISCLOSURE

The present disclosure relates to optoelectronic modules including optoelectronic device subassemblies and methods for their manufacture.

BACKGROUND

Optoelectronic modules that include optoelectronic devices such as optical signal sensors and/or emitters can be integrated, for example, into various types of consumer electronics and other devices such as mobile phones, smart phones, personal digital assistants (PDAs), tablet computers and laptops, as well as other electronic devices, such as bio devices, mobile robots, and surveillance cameras, among others.

Wafer-level processes can be advantageous because they allow multiple components to be fabricated at the same time (i.e., in parallel). In this context, a wafer refers to a substantially disk- or plate-like shaped item, whose extension in one direction (e.g., z-direction or vertical direction) is small with respect to its extension in the other two directions (e.g., x- and y- or lateral directions). In some cases, wafer-level processes can facilitate tens, hundreds or even thousands of identical components to be fabricated in each lateral direction of the wafers.

SUMMARY

The present disclosure describes wafer-level processes for fabricating optoelectronic device subassemblies (e.g., optical sensor or emitter device subassemblies) that can be mounted, for example, to a circuit substrate, such as a flexible cable or printed circuit board (PCB), and integrated into optoelectronic modules that include one or more optical subassemblies stacked over the optoelectronic device subassembly.

The techniques can, in some instances, help overcome problems that may otherwise occur when solder reflow processes are used to mount the optoelectronic device subassemblies. For example, by mounting the optoelectronic device subassembly to the circuit substrate prior to attaching the optical subassemblies to the optoelectronic device subassembly, the optical subassemblies need not be subjected to the high temperatures used during solder reflow. This can be advantageous, for example, where the materials used for the optical subassemblies are not able to withstand the relatively high temperatures that are sometimes used during the solder reflow process.

In one aspect, for example, the present disclosure describes a method of manufacturing an optoelectronic module. The method includes fabricating optoelectronic device subassemblies in a wafer-level process, mounting a singulated one of the optoelectronic device subassemblies onto a circuit substrate, and subsequently attaching one or more optical subassemblies to the optoelectronic device subassembly.

Some implementations include one or more of the following features. For example, in some cases, mounting the singulated optoelectronic device subassembly onto the circuit substrate includes using solder reflow technology. Thus, in some instances, even though the one or more optical subassemblies are composed of materials that are not reflow compatible, the optoelectronic device subassembly can be mounted onto the circuit substrate using solder reflow technology. In some cases, mounting the singulated optoelectronic device subassembly onto the circuit substrate includes performing one or more processes at relatively high temperatures (e.g., as high as 260° C.). Mounting the optoelectronic device subassembly can include, for example, mounting it onto a flexible cable.

In some cases, attaching one or more optical subassemblies to the optoelectronic device subassembly includes attaching at least two optical subassemblies in a stack over the optoelectronic device subassembly. In some implementations, the optical subassemblies themselves are manufactured in wafer-level processes. The optical subassemblies can be singulated before attaching them to the optoelectronic subassemblies. In some instances, the optical subassemblies include a light guide, an optical diffuser and/or an IR absorber.

In some implementations, attaching one or more optical subassemblies to the optoelectronic device subassembly includes placing at least one of the optical subassemblies onto a ledge of the optoelectronic device subassembly. Some implementations include placing a first one of the optical subassemblies onto a first ledge of the optoelectronic device subassembly and placing a second one of the optical subassemblies onto a second ledge of the optoelectronic device subassembly.

In another aspect, a wafer-level method of manufacturing optoelectronic device subassemblies includes providing a substrate on which optoelectronic devices are mounted. Trenches are formed in respective trenches in respective regions of opaque encapsulant that separate adjacent ones of the optoelectronic devices from one another. Each trench extends at least partially through the opaque encapsulant, which is substantially opaque to a wavelength or range of wavelengths of radiation emitted by or detectable by the optoelectronic devices. The method further includes dicing the substrate at locations of the trenches so as to form singulated optoelectronic device subassemblies each of which includes at least one of the optoelectronic devices surrounded laterally by the opaque encapsulant.

Formation of the trenches can, in some instances, be implemented as stress release dicing to help improve reliability. In some instances, prior to dicing the substrate into singulated optoelectronic device subassemblies, some of the opaque encapsulant at upper edges of each trench is removed so as to form steps adjacent the trench. Formation of the steps adjacent the trenches can, in some cases, help provide space for excess adhesive to flow when an optical subassembly subsequently is mounted to the optoelectronic device subassembly.

Some implementations include one or more of the following features. For example, the method can include providing a protective covering over wiring for the optoelectronic devices. The protective covering can include, for example, a PDMS coating or an epoxy containing an oxide filler. In some instances, after providing the protective covering for the wiring, but before forming the respective trenches in the opaque encapsulant, a transparent encapsulant is provided over the substrate, including the optoelectronic devices. The transparent encapsulant preferably is substantially transparent to a wavelength or range of wavelengths of radiation emitted by or detectable by the optoelectronic devices. The transparent encapsulant can be removed from regions where the opaque encapsulant is to be provided, and then the opaque encapsulant can be provided in regions where the transparent encapsulant was removed. In some cases, at least one of the transparent encapsulant or opaque encapsulant is provided by a vacuum injection technique.

In some instances, the method includes mounting at least one of the singulated optoelectronic device subassemblies on a printed circuit board or flexible substrate. The singulated optoelectronic device subassembly can be mounted, for example, using a solder reflow process and may include elevated temperatures (e.g., as high as 260° C.).

Various examples are described in greater detail below. Other aspects, features and advantages will be readily apparent from the following detailed description, the accompanying drawings and the claims.

DETALED DESCRIPTION

Figure 1A:
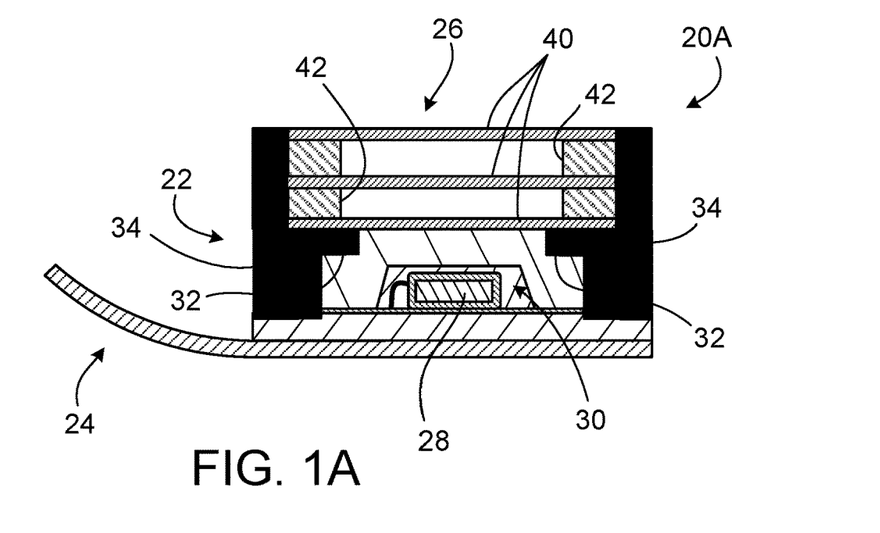
FIG. 1A is a first example of an optoelectronic module.
Figure 1B:
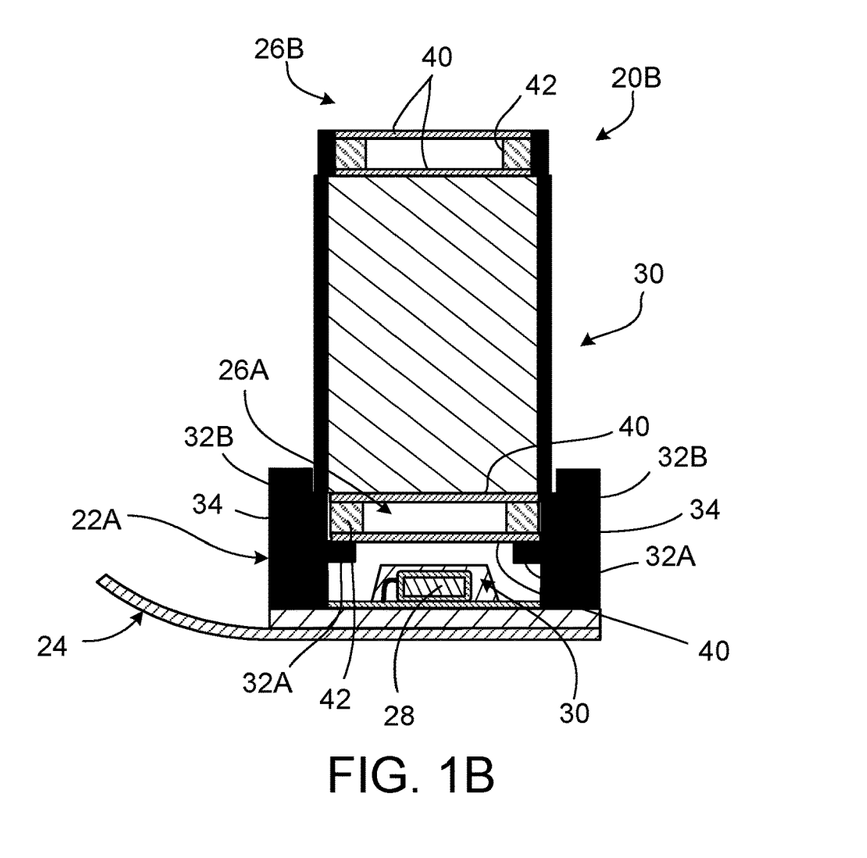
FIG. 1B is a second example of an optoelectronic module.

FIGS. 1A and 1B illustrate examples of optoelectronic modules that can be fabricated in accordance with the processes described here. As shown in FIG. 1A, an optoelectronic module 20A includes an optoelectronic device subassembly 22 mounted on a circuit substrate 24 such as a flexible circuit cable or other printed circuit board. The optoelectronic device subassembly 22 can include, for example, an active optoelectronic device 28 such as a light sensor (e.g., a photodiode, or a CCD or CMOS sensor) that includes radiation sensitive elements (e.g., pixels). In some cases, the optoelectronic device 28 includes a light emitter (e.g., light emitting diode (LED), infra-red (IR) LED, organic LED (OLED), infra-red (IR) laser or vertical cavity surface emitting laser (VCSEL). In some cases, the optoelectronic device 28 is implemented as an integrated circuit (IC) semiconductor chip or as an application-specific integrated circuit (ASIC) semiconductor chip. To protect electrically conductive connections (e.g., wiring) 29 for the optoelectronic device 28, the wiring 29 can be covered, for example, by a protective covering 30 such as a polydimethylsiloxane (PDMS) spray coating, or a curable epoxy containing an oxide filler (e.g., $SiO_2$, $Al_2O_3$, or $TiO_2$). In the latter case, the epoxy can be cured after dispensing it over the wiring 29.

As further illustrated in FIG. 1A, the module 20A includes an optical subassembly (e.g., an optical diffuser or infra-red (IR) absorber) 26. The optical subassembly 26 is disposed over the optoelectronic device subassembly 22 and can rest on a support spacer or ledge 32 that is integrally formed as a unitary piece with the walls 34 of the optoelectronic device subassembly 22. Thus, the walls 34 and ledge 32 can be composed of the same material (e.g., a black epoxy). In some cases, the support spacer or ledge 32 is annular shaped.

In the illustrated example, the optical subassembly 26 includes a stack of one or more optical elements 40 separated from one another by micro-spacers 42. In some implementations, the optical elements 40 include a dielectric filter or interference filter designed to operate in contact with a material having a particular refractive index (e.g., air or vacuum). Further, in some implementations, the optical elements 40 are polymer-based filters (e.g., IR absorbers). In some implementations, the optical elements 40 are diffusers (e.g., diffuser foils) designed to operate in contact with a material of a particular refractive index (e.g., air or vacuum).

In the illustrated example, the optical elements 40 are separated from one another by small air or vacuum gaps. The micro-spacers 42 separate the optical elements 40 from one another and establish a small fixed distance between them. Each of the micro-spacers 42 can have, for example, an annular shape or a closed rectangular loop shape that laterally surrounds an air or vacuum gap.

FIG. 1B illustrates an optoelectronic module 20B that, like the module 20A of FIG. 1A, includes a optoelectronic device subassembly 22A mounted on a circuit substrate 24 such as a flexible circuit cable or other PCB. Disposed over the optoelectronic device subassembly 22A is a stack of optical subassemblies, including a first optical subassembly 26A, a light guide 30 and a second optical subassembly 26B. Some details of the optoelectronic device subassembly 22A of FIG. 1B are similar to those described above with respect to the optoelectronic device subassembly 22 of FIG. 1A, but the optoelectronic device subassembly 22A includes a first support spacer or ledge 32 on which a first optical subassembly 26A rests and a second support ledge 32B on which a light guide 30 rests. In some cases, the support ledges 32, 32B are annular shaped. Each of the optical subassemblies 26A, 26B can include a stack of one or more optical elements 40 separated from one another by micro-spacers 42. Details of the optical elements 40 and micro-spacers 42 can be similar to those described above in connection with FIG. 1A.

Figure 2:
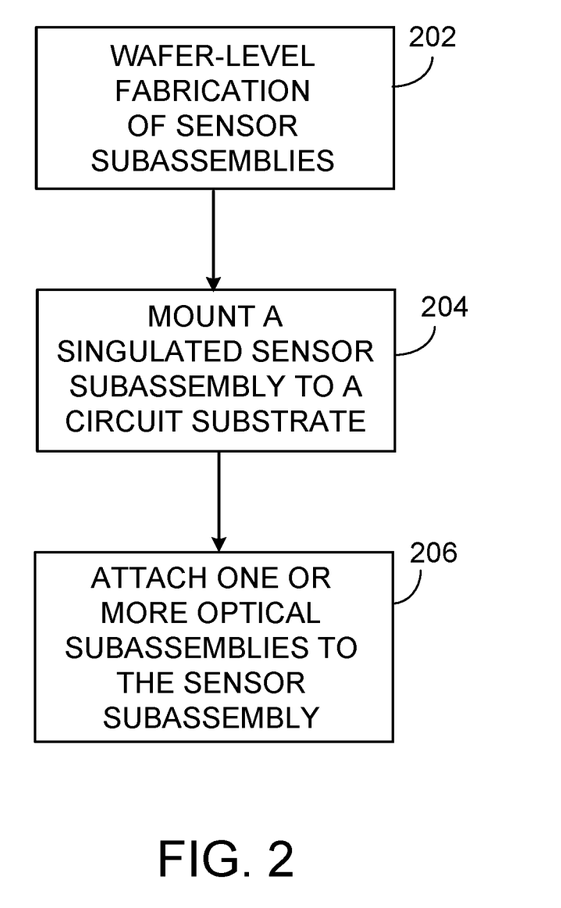
FIG. 2 is a flow chart for fabrication of optoelectronic modules such as those illustrated in FIGS. 1A and 1B.

As illustrated in FIG. 2, the modules 20A, 20B can be fabricated, for example, as follows. Optoelectronic device subassemblies, such as the subassembly 22 (or 22A), can be fabricated as part of a wafer-level process (202). A singulated optoelectronic device subassembly then can be mounted to a circuit substrate (e.g., a flexible cable or other printed circuit board) (204). In some instances, mounting the optoelectronic device subassembly on the circuit substrate may involve using reflow solder technology at relatively high temperatures (e.g., as high as 260° C.). After mounting the optoelectronic device subassembly to the circuit substrate, one or more optical subassemblies (e.g., optical diffusers, IR absorbers, light guides) are disposed over, and attached to, the optoelectronic device subassembly (206). Examples of the optical subassemblies are indicated by 26 (FIG. 1A) and 26A, 26B, 30 (FIG. 1B). The optical subassemblies can be placed over the optoelectronic device subassembly, for example, by pick-and-place equipment and attached, for example, by an adhesive.

By mounting the optoelectronic device subassembly to the circuit substrate prior to attaching the optical subassemblies to the optoelectronic device subassembly, the optical subassemblies need not be subjected to the relatively high temperatures used during solder reflow. This can be advantageous because, in some cases, the materials used for the optical subassemblies are not able to withstand the temperatures used during the solder reflow process.

Figure 3:
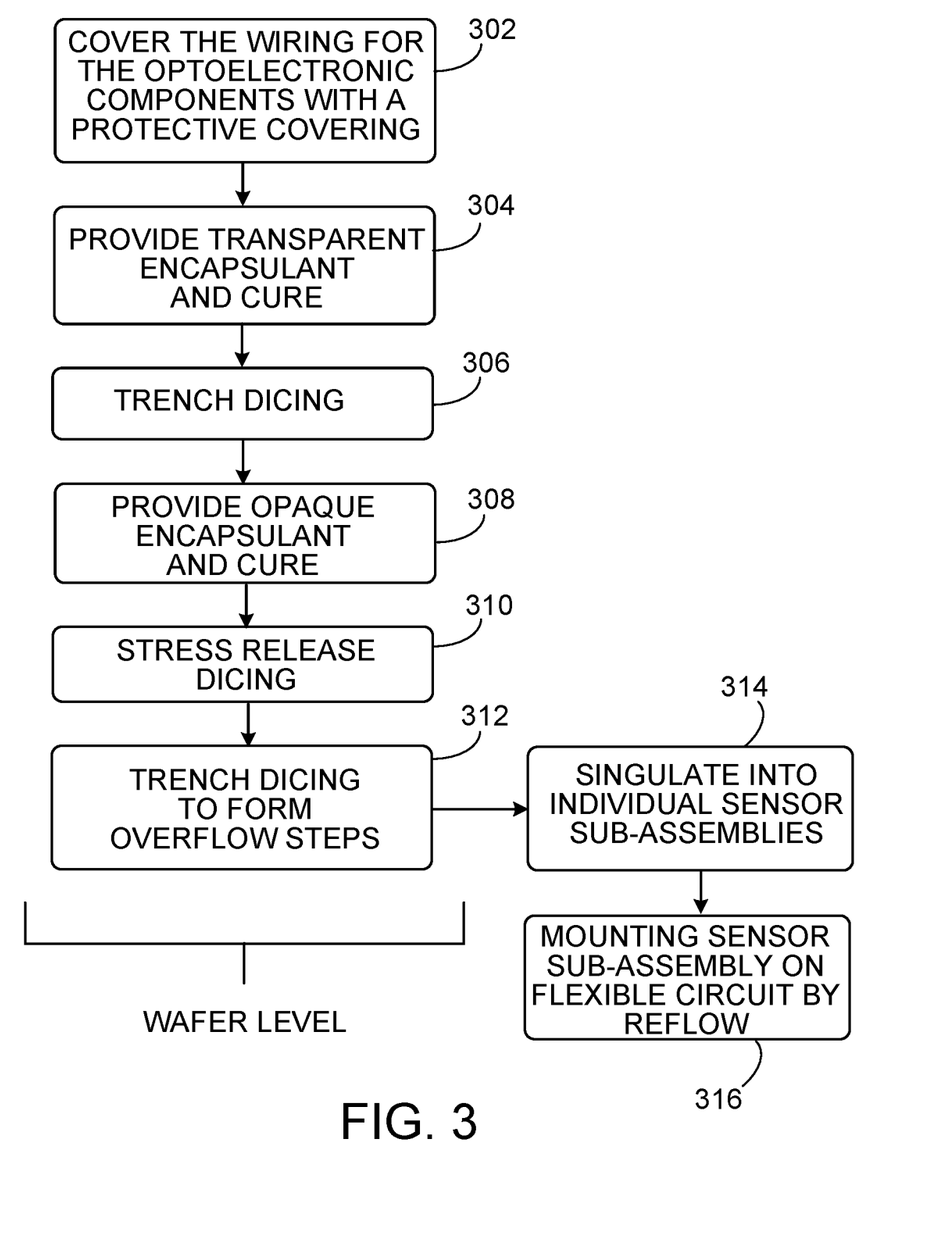
FIG. 3 is a flow chart for fabrication of optoelectronic device subassemblies.
Figure 4A:
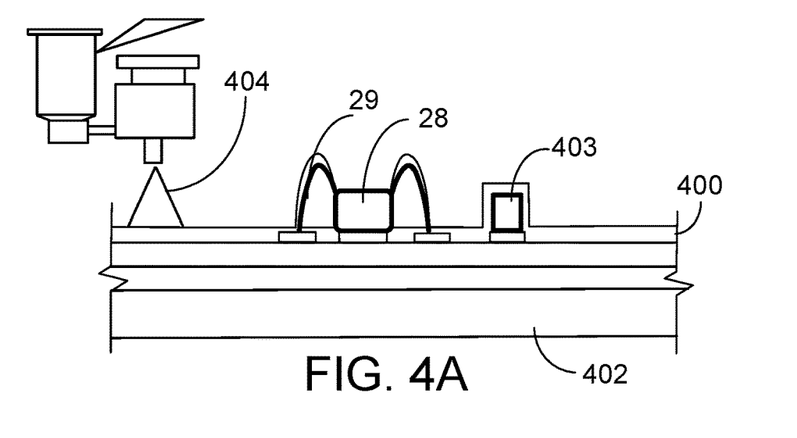
FIGS. 4A through 4H illustrates various stages in the fabrication process for the optoelectronic device subassemblies.

An example of further details for the wafer-level fabrication of optoelectronic device subassemblies (202 in FIG. 2) is provided in FIG. 3. As indicated by 302 in FIG. 3 and as shown in FIG. 4A, a protective covering 404 is provided over the wiring 29 for the optoelectronic devices (e.g., light sensors or light emitters) 28 mounted on a PCB or other wafer 400. In some instances, the covering 404 is composed of PDMS dispensed (e.g., by spray coating) over the wiring 29. In some cases, the PDMS is provided over the optoelectronic components 28 as well as other integrated circuit chips 403 that may be mounted on the wafer 400 and coupled to the optoelectronic components 28. In some instances, the protective covering 404 over the wires 29 is composed of an epoxy containing an oxide filler (e.g., $SiO_2$, $Al_2O_3$, or $TiO_2$). The addition of the filler can help increase the mechanical stability of the epoxy. However, as the addition of $SiO_2$ or other oxide may decrease the transparency of the epoxy, the optoelectronic devices 28 themselves should not be covered with the epoxy. The wafer 400 can be supported, for example, on a support substrate 402.

Figure 4B:
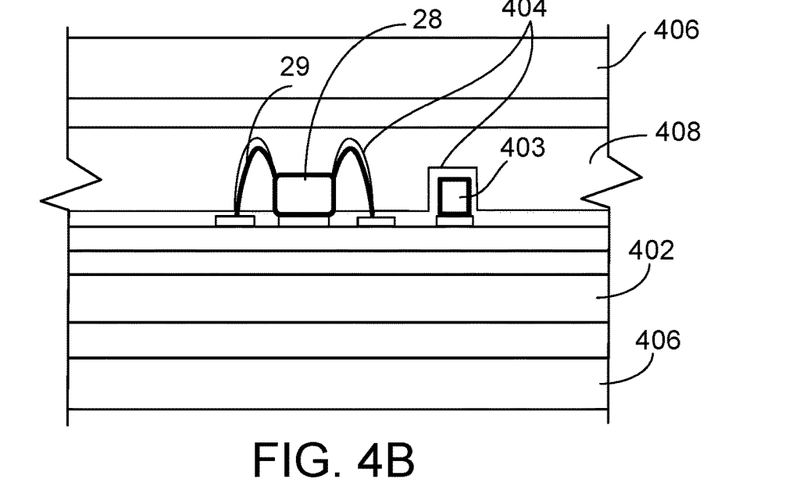
Figure 4C:
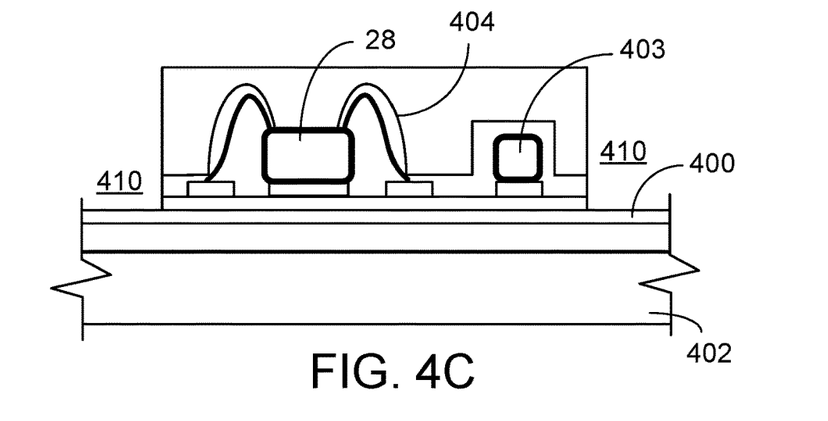

As indicated by 304 in FIG. 3 and as shown in FIG. 4B, the wafer 400 then is placed in a vacuum injection molding tool 406, and transparent encapsulant 408 is injected so as to cover the wafer 400, including the optoelectronic devices 28 mounted thereon. The transparent encapsulant 408 is substantially transparent to a wavelength or range of wavelengths of radiation emitted by or detectable by the optoelectronic devices 28. The encapsulant 408 then can be hardened, for example, by thermal or UV curing. Next, after removing the wafer 400 from the vacuum injection tool 406, trench dicing is performed to form gaps 410 between adjacent ones of the optoelectronic devices 28 (see FIG. 4C, and 306 in FIG. 3).

Figure 4D:
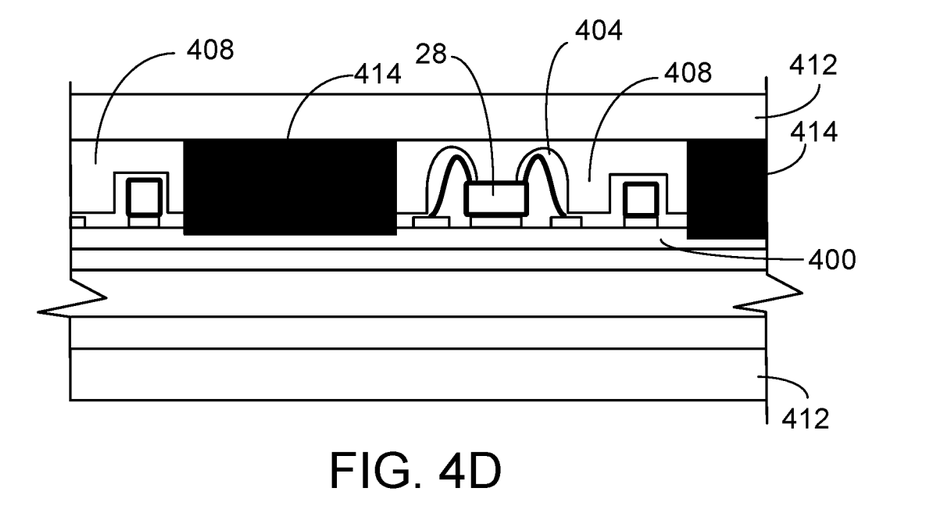

As indicated by 308 in FIG. 3 and as shown in FIG. 4D, the wafer 400 then is placed into another vacuum injection tool 412, and an opaque encapsulant 414 is injected into the gaps 410. The opaque encapsulant 414, which is substantially opaque to a wavelength or range of wavelengths of radiation emitted by or detectable by the optoelectronic devices 28, substantially fills the gaps (410) between adjacent ones of the optoelectronic devices 28. The encapsulant 414 then can be hardened, for example, by thermal and/or UV curing.

Figure 4E:
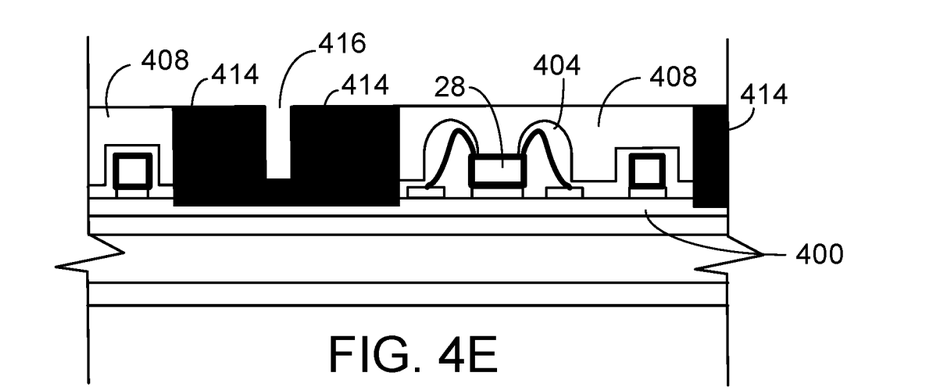

After removing the wafer 400 from the vacuum injection tool 412, stress release dicing is performed to form a trench 416 in each region of the opaque encapsulant 414 (see FIG. 4E, and 310 in FIG. 3). At this stage of the process, the trench 416 extends partially through the opaque encapsulant 414, but preferably the bottom of the trench does not reach the upper surface of the wafer 400. Such stress release dicing can, in some instances, help improve reliability.

Figure 4F:
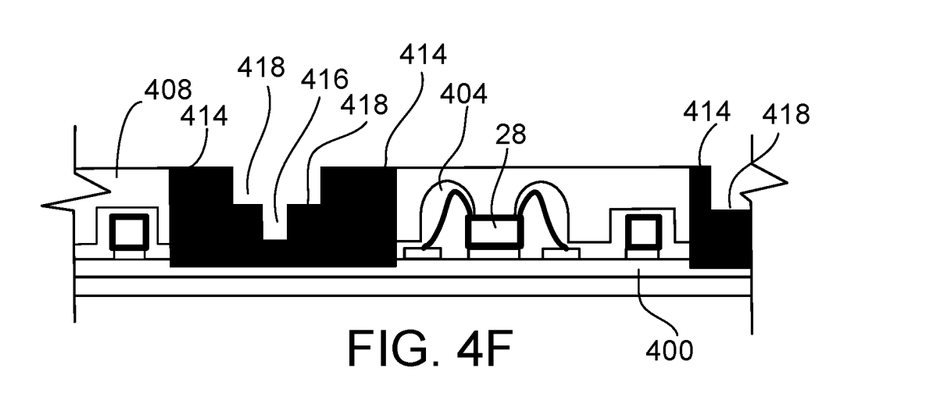

In some implementations, as indicated by 312 in FIG. 3 and as shown in FIG. 4F, a further trench dicing process is performed to form "overflow" steps 418 at the edges of each region of opaque encapsulant 414. Thus, steps 418 are formed adjacent either side of each trench 416. The overflow steps 418 can help provide space for excess glue or other adhesive to flow when an optical subassembly 26 (or 26A) subsequently is mounted to the optoelectronic device subassembly 420.

Figure 4G:
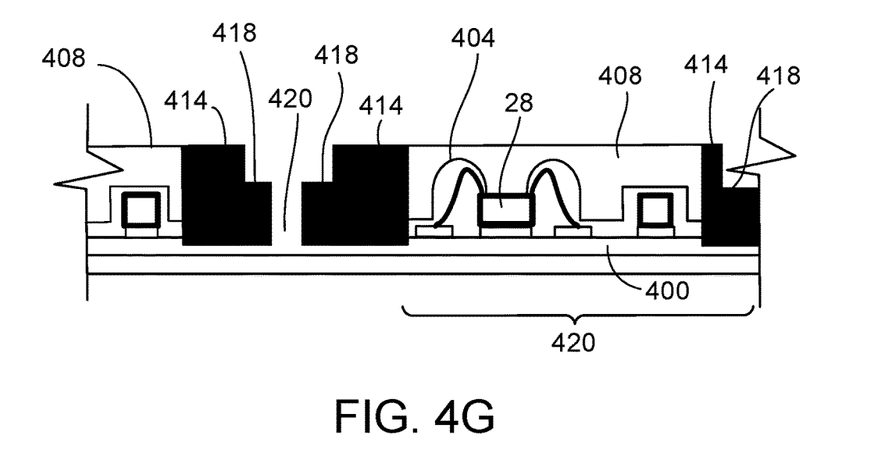
Figure 4H:
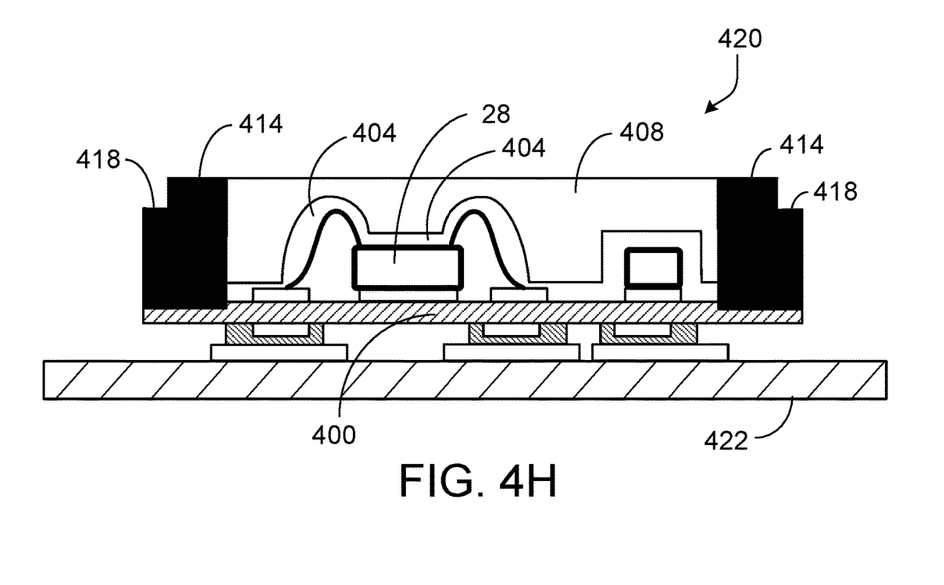

Next, as indicated by 314 in FIG. 3 and as shown in FIG. 4G, further dicing is performed so as to singulate the optoelectronic device subassemblies 420 from one another. This additional dicing 314 can be performed at the locations of the trenches 416 (i.e., along the stress release lines) previously formed during the stress release dicing step 310. The dicing 314 is performed through the opaque encapsulant 414 and through the wafer substrate 400, thereby singulating the wafer 400 into multiple optoelectronic device subassemblies 420. As indicated by 316 in FIG. 3 and as shown in FIG. 4H, each singulated optoelectronic device subassembly 420 then can be mounted, for example, on a flexible PCB or other substrate 422. Reflow processes may be used to mount the optoelectronic device subassemblies 420 to the substrates 422.

Various modifications can be made to the implementations described above, and features described or shown in connection with different implementations can, in some cases, be included in the same implementation. Accordingly, other implementations are within the scope of the claims.

What is claimed is:

1. A method of manufacturing an optoelectronic module, the method comprising:
fabricating optoelectronic device subassemblies in a wafer-level process;
mounting a singulated one of the optoelectronic device subassemblies onto a circuit substrate; and
subsequently attaching one or more optical subassemblies to the optoelectronic device subassembly mounted on the circuit substrate, wherein attaching one or more optical subassemblies to the optoelectronic device subassembly includes attaching at least two optical subassemblies in a stack over the optoelectronic device subassembly mounted on the circuit substrate.

2. The method of claim 1 wherein mounting the singulated optoelectronic device subassembly onto the circuit substrate includes using solder reflow technology.

3. The method of claim 2 wherein the at least two optical subassemblies are composed of materials that are not reflow compatible.

4. The method of claim 1 wherein mounting a singulated one of the optoelectronic device subassemblies onto a circuit substrate includes mounting the singulated optoelectronic device subassembly onto a flexible cable.

5. The method of claim 1 wherein the at least two optical subassemblies include a light guide and at least one optical diffuser or IR absorber.

6. The method of claim 1 wherein the at least two optical subassemblies include at least one optical diffuser or IR absorber.

7. The method of claim 1 including placing at least one of the at least two optical subassemblies onto a ledge of the optoelectronic device subassembly.

8. The method of claim 1 including placing a first one of the at least two optical subassemblies onto a first ledge of the optoelectronic device subassembly and placing a second one of the at least two optical subassemblies onto a second ledge of the optoelectronic device subassembly.

9. The method of claim 8 wherein the first and second ledges are recessed.

10. A wafer-level method of manufacturing optoelectronic device subassemblies, the method comprising:
providing a substrate on which optoelectronic devices are mounted;
forming respective trenches in respective regions of opaque encapsulant separating adjacent ones of the optoelectronic devices from one another, wherein each trench extends at least partially through the opaque encapsulant, the opaque encapsulant being substantially opaque to a wavelength or range of wavelengths of radiation emitted by or detectable by the optoelectronic devices; and dicing the substrate at locations of the trenches so as to form singulated optoelectronic device subassemblies each of which includes at least one of the optoelectronic devices surrounded laterally by the opaque encapsulant.

11. The method of claim 10 further including removing, prior to dicing the substrate to form the singulated optoelectronic device subassemblies, some of the opaque encapsulant at upper edges of each trench so as to form steps adjacent the trench.

12. The method of claim 10 further including providing a protective covering over wiring for the optoelectronic devices.

13. The method of claim 12 further including, after providing the protective covering but before forming the respective trenches in the opaque encapsulant:
provide a transparent encapsulant over the substrate, including the optoelectronic devices, the transparent encapsulant being substantially transparent to a wavelength or range of wavelengths of radiation emitted by or detectable by the optoelectronic devices;
removing the transparent encapsulant from regions where the opaque encapsulant is to be provided; and
providing the opaque encapsulant in regions where the transparent encapsulant was removed.

14. The method of claim 12 providing at least one of the transparent encapsulant or opaque encapsulant by a vacuum injection technique.

15. The method of claim 12 wherein providing a protective covering includes providing the PDMS coating by a spray coating technique.

16. The method of claim 12 wherein providing a protective covering includes providing an epoxy containing an oxide filler.

17. The method of claim 10 further including:
mounting at least one of the singulated optoelectronic device subassemblies on a printed circuit board.

18. The method of claim 10 further including:
mounting at least one of the singulated optoelectronic device subassemblies on a flexible substrate.

19. The method of claim 10 further including mounting at least one of the singulated optoelectronic device subassemblies using a solder reflow process.

20. A method of manufacturing an optoelectronic module, the method comprising:
fabricating optoelectronic device subassemblies in a wafer-level process;
mounting a singulated one of the optoelectronic device subassemblies onto a circuit substrate; and
subsequently attaching one or more optical subassemblies to the optoelectronic device subassembly mounted on the circuit substrate, wherein attaching the one or more optical subassemblies includes placing at least one of the optical subassemblies onto a recessed ledge of the optoelectronic device subassembly.

* * * * *